United States Patent [19]
Mudra et al.

[11] Patent Number: 5,315,263
[45] Date of Patent: May 24, 1994

[54] PUSH-PULL AMPLIFIER HAVING BOOTSTRAP CAPACITOR ISOLATION

[75] Inventors: Robert E. Mudra, Glenview; Mark A. Scholten, Rolling Meadows, both of Ill.

[73] Assignee: Zenith Electronics Corp., Glenview, Ill.

[21] Appl. No.: 998,280

[22] Filed: Dec. 23, 1992

[51] Int. Cl.⁵ .............................................. H03F 3/26
[52] U.S. Cl. .................................... 330/156; 330/267
[58] Field of Search ............... 330/156, 263, 267, 268, 330/273, 274; 381/120

[56] References Cited
U.S. PATENT DOCUMENTS
Re. 29,273  6/1977  Reiffin .............................. 330/274 X Primary Examiner—Steven Mottola

[57] ABSTRACT

An audio power amplifier includes a stacked pair of complementary transistors having the emitters commonly coupled to a load. A driver stage couples the bases of the stacked pair to a source of audio frequency signal. A bootstrap capacitor is coupled between the commonly coupled output node and the supply voltage. An isolation diode is interposed between the bootstrap capacitor and the operating supply to prevent discharge of the bootstrap capacitor into the operating supply during positive signal swings.

6 Claims, 1 Drawing Sheet

PUSH-PULL AMPLIFIER HAVING BOOTSTRAP CAPACITOR ISOLATION

FIELD OF THE INVENTION

This invention relates generally to audio amplifiers and particularly to those known as bootstrap amplifiers.

BACKGROUND OF THE INVENTION

Within most, if not all, television receivers, sound or audio information present in the received signal is detected and processed at a low power level to provide an audio signal. This low level audio signal is then amplified by one or more audio frequency amplifiers to a voltage and power level sufficient to drive the television receiver speakers.

As with other audio power amplifiers, television audio amplifiers are to the extent possible optimized for power output and linearity. In most circumstances, the needs of such power amplifiers relate directly to full use of the available supply voltage and optimum drive current to the output amplifying stage. In consumer oriented television receivers, however, competitive costs must be maintained and thus unlimited resources are not available to provide substantial power and linearity at the expense of great cost premiums.

As a result, designers of television receiver audio systems generally are required to limit the number and type of audio power amplifiers used within television receivers. One of the most cost effective high performance amplifier structures used in the art is that known commonly as a "bootstrap" amplifier. In such bootstrap amplifiers, stacked output transistor stages are coupled to a bootstrap capacitor which charges during one portion of the audio signal cycle and thereafter discharges during the remaining portion of the signal cycle to supplement the drive current provided to the stacked transistor pair. Thus, the bootstrap capacitor is intended to supply more drive current to the output transistor pair without the use of more expensive additional predriver stages or higher power supply voltage. Bootstrap amplifiers themselves, are subject to certain operational limitations. One of such limitations arises through the loss of drive energy during portions of the signal cycle resulting from bootstrap capacitor discharge into the operating supply source. This loss of drive energy during a portion of the signal cycle results in nonlinearity of high amplitude output signal swings. Faced with this problem, most practitioners in the art attempt to comprise the signal handling capability of the power amplifier against the undesired nonlinearity during large signal swings.

There arises, therefore, a need in the art for evermore improved cost effective power amplifiers for use in television receiver audio systems.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawing, in which:

The FIGURE sets forth a schematic diagram of an amplifier having bootstrap capacitor isolation constructed in accordance with the present invention.

DESCRIPTION OF THE PREFERRED EMBODIMENT

Figure 1:
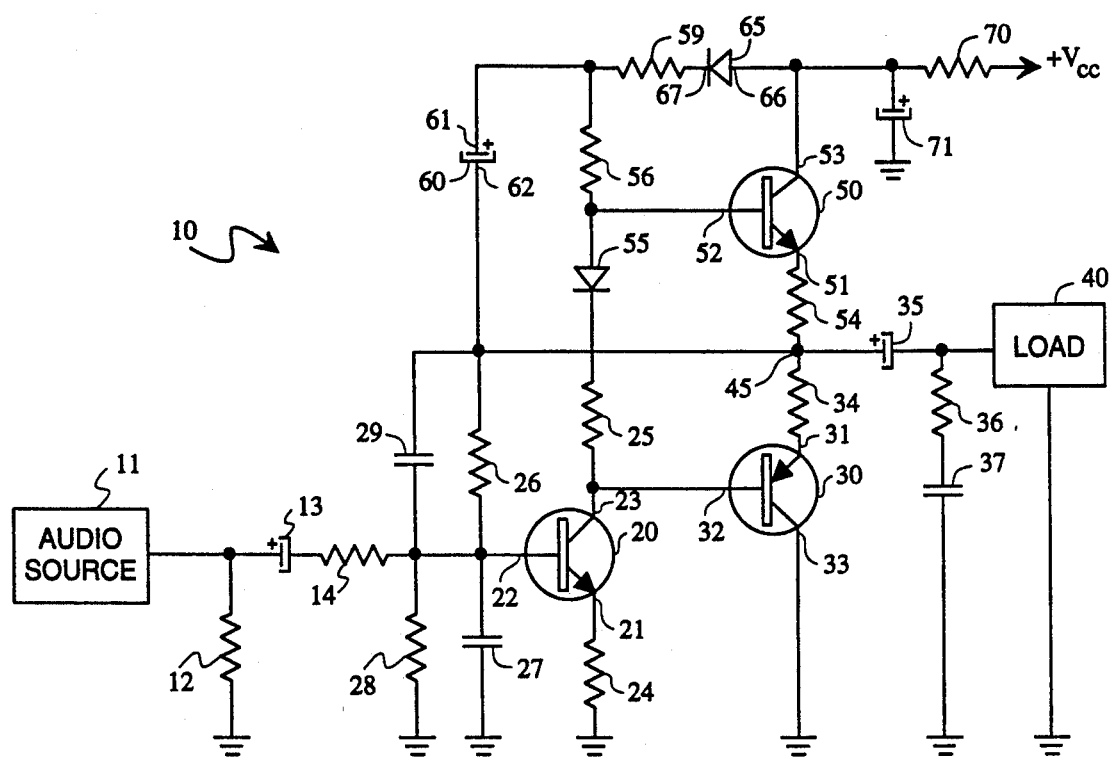

The FIGURE sets forth a schematic diagram of an audio amplifier constructed in accordance with the present invention and generally referenced by numeral 10. Amplifier 10 includes an NPN transistor 20 having an emitter 21 coupled to ground by a resistor 24, a base 22 coupled to ground by the parallel combination of a resistor 28 and a capacitor 27, and a collector 23. A source of audio frequency signal 11 is coupled to base 22 of transistor 20 by a series combination of a capacitor 13 and a resistor 14. The output of audio source is further coupled to ground by a resistor 12. A PNP transistor 30 includes an emitter 31 coupled to an output node 45 by a resistor 34, a base 32 coupled to collector 23 of transistor 20, and a collector 33 coupled to ground. Output node 45 is coupled to a load impedance 40 such as a conventional speaker or combination of speakers by an electrolytic capacitor 35. The input to load impedance 40 is further coupled to ground by a series combination of a resistor 36 and a capacitor 37. A parallel combination of a resistor 26 and a capacitor 29 is coupled between output node 45 and base 22 of transistor 20.

An NPN transistor 50 includes an emitter 51 coupled to output node 45 by a resistor 54, a base 52 coupled to collector 23 of transistor 20 by a series combination of a diode 55 and a resistor 25, and a collector 53 coupled to a source of operating potential (VCC) by a resistor 70. Collector 53 is further coupled to ground by an electrolytic capacitor 71. A bootstrap capacitor 60 comprises an electrolytic capacitor having a negative plate 62 coupled to output node 45 and a positive plate 61 coupled to base 52 of transistor 50 by a resistor 56. A series combination of an isolation diode 65 and a resistor 59 is coupled between collector 53 of transistor 50 and positive plate 61 of bootstrap capacitor 60.

In operation, and by way of overview, driver transistor 20 couple the audio frequency signal produced by audio source 11 to output transistors 30 and 50 which in turn amplify the applied signal at output node 45 which is then coupled by electrolytic capacitor 35 to load 40. During positive swings of the applied audio signal at base 22 of transistor 20, output node 45 swings negative and bootstrap capacitor 60 is charged through diode 65 and resistor 59. During negative input signal swings, output node 45 swings positive and capacitor 60 is raised and discharges through resistor 56 to supply base current to transistor 50. In accordance with an important aspect of the present invention, as capacitor 60 is raised during positive voltage swings, the positive voltage at plate 61 of capacitor 60 rises above operating supply voltage VCC turning off diode 65 and isolating capacitor 60 from the operating supply. Thus, the entire charge within bootstrap capacitor 60 is available for supplying base current to transistor 50, greatly improving the linear range and signal handling capability of amplifier 10.

More specifically, the output signal from audio source 11 is AC coupled by electrolytic capacitor 13 to base 22 of transistor 20 by resistor 14. As the input signal undergoes a negative swing, the conduction of transistor 20 diminishes raising the voltage at collector 23. The raised voltage at collector 23 is applied to base 32 of transistor 30 turning transistor 30 off. The rising collector voltage at collector 23 of transistor 20 is also coupled to base 52 of transistor 50 by resistor 25 and diode 55 turning transistor 50 on and supplying current to load 40 through resistor 54 and capacitor 35.

A positive input signal swing at base 22 causes the voltage at output node 45 to drop. Since output node 45 is connected to negative plate 62 of bootstrap capacitor 60, its voltage also drops. Because positive plate 61 of bootstrap capacitor 60 is coupled to operating supply VCC by resistors 59 and 70 and diode 65, plate 61 remains substantially close to operating supply. Thus, as the voltage at negative plate 62 is decreased during positive swings of input signal, a voltage is applied across boot strap capacitor 60 causing capacitor 60 to charge.

For a negative input signal swing at base 22, the voltage at output node 45 increases which in turn raises the voltage at negative plate 62 of bootstrap capacitor 60 terminating the charging process. As the voltage at output node 45 and plate 62 of bootstrap capacitor 60 continues to rise due to transistor 50 conduction, the voltage at positive plate 61 of bootstrap capacitor 60 is raised above operating supply voltage VCC.

In accordance with an important aspect of the present invention, isolation diode 65 turns off as plate 61 of boot strap capacitor 60 rises toward operating supply voltage raising the voltage at cathode 67 with respect to anode 66 above the cutoff voltage. Thus, diode 65 is turned off and isolates the charge on bootstrap capacitor 60 from operating supply VCC during positive output voltage swings. Without the inclusion of isolation diode 65, a substantial portion of the charge within bootstrap capacitor 60 would be simply lost by the discharge of capacitor 60 into the operating supply. In accordance with the invention, however, the charge within capacitor 60 is discharged through resistor 56 to provide base current for transistor 50 thereby increasing its signal handling capability.

As the input signal at audio source 11 and base 22 of transistor 20 undergoes a negative swing, transistor 20 stops conducting heavily increasing the voltage at collector 23 and turning on transistor 50. Concurrently, as transistor 50 turns on, the voltage at output node 45 rises bringing positive plate 61 of capacitor 60 above operating supply VCC inhibiting further charging of bootstrap capacitor 60.

A decreasing voltage at collector 23 of transistor 20 is coupled to base 52 of transistor 50 reducing the conduction of transistor 50 and eventually bringing transistor 50 close to cut-off. With transistor 50 nearly cut off and transistor 30 conducting, the voltage at output node 45 drops which in turn drops capacitor plate 62 of boot strap capacitor 60 and begins the boot strap capacitor charging portion of the cycle.

This process repeats as the input signal at base 22 of transistor 20 produced by audio source 11 continues to undergo positive and negative input swings. It should be noted that the use of isolation diode 65 permits the use of a substantially lower value resistance for resistor 59. In prior art systems, the resistance in series with the bootstrap capacitor must be substantially greater than that used in the present invention system to prevent undue loss of bootstrap capacitor charge into the operating supply. In the present invention system, however, diode 65 prevents such energy loss and thus resistor 59 may be selected to have a smaller resistance value which in turn permits substantially greater charging of bootstrap capacitor 60. The increased charging of bootstrap capacitor 60 in turn assures that a substantially increased charge is available to supply base current for transistor 50 improving its linearity and signal handling capability.

It will be apparent to those skilled in the art that the orientation of bootstrap capacitor 60 and diode 65 as well as the use of an NPN transistor for transistor 20 accommodates the polarity of operating supply voltage and the arrangement of complimentary pair transistors 30 and 50. It will be equally apparent to those skilled in the art that a negative polarity operating supply may be used in which event complimentary pair transistors 30 and 50 would be interchanged from the positions shown in the FIGURE. Correspondingly, the orientations of bootstrap capacitor 60 and diode 65 would be reversed and a PNP transistor would be substituted for NPN transistor 20 to accommodate the negative operating supply. It will be equally apparent to those skilled in the art that this "reverse polarity" version of the circuit shown is embraced within the spirit and scope of the present invention.

What has been shown is an improved amplifier having bootstrap capacitor isolation which permits increased charging of the bootstrap capacitor by isolating the bootstrap capacitor from operating supply during positive signal swings. As a result, substantially greater base current is available for the output power gain stage of the amplifier. In addition, the isolation of the bootstrap capacitor avoids loss of energy to the operating supply and improves the linearity and signal handling capability of the system.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. An amplifier operated from a source of supply voltage, said amplifier comprising:
   a pair of complementary output transistors having emitter electrodes commonly coupled to form an output node and commonly coupled base electrodes;
   a driver transistor having an input electrode, a common electrode and an output electrode coupled to said commonly coupled base electrodes;
   means for coupling said input electrode of said driver transistor to a source of input signal;
   a bootstrap capacitor having a first plate coupled to said output node and a second plate; and
   an isolation switch coupled between said source of operating supply and said second plate of said bootstrap capacitor to decouple said bootstrap capacitor from said source of operating supply when the voltage upon said second plate of said bootstrap capacitor exceeds that of said source of operating supply.

2. An amplifier as set forth in claim 1 wherein said isolation switch includes a diode having an anode coupled to said source of operating supply and a cathode coupled to said bootstrap capacitor.

3. An amplifier as set forth in claim 2 wherein said pair of complementary output transistors includes an NPN transistor having a collector electrode coupled to said source of operating supply voltage and a PNP transistor having a collector electrode coupled to ground.

4. For use in combination with a source of input signal, a load and a source of operating supply voltage, a bootstrap amplifier comprising:
- an NPN transistor having a collector coupled to said source of operating supply voltage, a base, and an emitter coupled to said load;
- a PNP transistor having a collector coupled to ground, an emitter coupled to said load, and a base coupled to said base of said NPN transistor;
- a driver transistor having a base coupled to said source of input signal, an emitter coupled to ground, and a collector coupled to said bases of said NPN and PNP transistors;
- a bootstrap capacitor having a positive plate coupled to said base of said NPN transistor and a negative plate coupled to said load; and
- an isolation diode having a cathode coupled to said positive plate of said bootstrap capacitor and an anode coupled to said source of operating supply voltage.

5. An amplifier as set forth in claim 4 further including a resistor coupled in series with said isolation diode.

6. An amplifier as set forth in claim 5 further including a resistor coupled between said positive plate of said bootstrap capacitor and said base of said NPN transistor.

* * * * *